United States Patent [19]  
Fukuwatari et al.

[11] Patent Number: 4,718,539  
[45] Date of Patent: Jan. 12, 1988

[54] CONVEYOR MEANS

[75] Inventors: Ichiro Fukuwatari, Cochigi; Seiji Watanabe; Naoyuki Takahashi, both of Sano; Takahisa Nitta, Fuchu; Yoshio Saito, Ome, all of Japan

[73] Assignees: Hitachi, Ltd., Tokyo; Hitachi Kiden Kogyo, Ltd., Hyogo, both of Japan

[21] Appl. No.: 6,249

[22] Filed: Jan. 9, 1987

Related U.S. Application Data

[63] Continuation of Ser. No. 688,401, Jan. 2, 1985, abandoned.

[51] Int. Cl.⁴ .............................................. B65G 35/00
[52] U.S. Cl. ..................................... 198/619; 104/292
[58] Field of Search ................. 198/619, 465.1, 803.01; 104/290, 292, 134, 155, 23.1, 23.2; 406/88; 414/676

[56] References Cited

U.S. PATENT DOCUMENTS

| 1,441,250 | 1/1923 | Smith | 198/619 |
| 3,257,964 | 6/1966 | Conners | 104/134 |
| 3,610,695 | 10/1971 | Yabuta | 198/619 |
| 3,651,985 | 3/1972 | Smith | 198/803.14 |
| 3,913,493 | 10/1975 | Maki et al. | 104/292 |
| 4,056,186 | 11/1977 | Hill | 198/465.1 |
| 4,540,326 | 9/1985 | Southworth et al. | 198/619 |

FOREIGN PATENT DOCUMENTS 3402143 8/1984 Fed. Rep. of Germany ...... 198/619

Primary Examiner—Joseph E. Valenza  
Attorney, Agent, or Firm—Wenderoth, Lind & Ponack

[57] ABSTRACT

A conveyor means for transporting precision parts is divided into a plurality of block units and compressed air is supplied selectively to each block unit where a transporting pallet is present so as to reduce consumption of compressed air to the minimum. Also, it ensures high carrying efficiency because of its slow starting and slow stopping without reducing the speed during running.

3 Claims, 6 Drawing Figures

CONVEYOR MEANS

This application is a continuation of now abandoned application Ser. No. 688,401, filed Jan. 2, 1985, now abandoned.

BACKGROUND OF THE INVENTION

1. Field of the Invention

This invention relates to a conveyor means which uses a linear motor for the manufacturing process of precision circuit parts in a clean room.

2. Prior Art

Conventionally, endless trolley conveyors of suspended type or the like are used widely as conveyor means, but trolley conveyors of this type adopt the system of slow starting-high speed transporting-slow stopping for the purpose of preventing package shaking and vibration. Therefore, this system requires reduction of the transporting speed to a large extent at the stages of slow starting and slow stopping, with the result of low transporting efficiency. In order to eliminate such disadvantage, conveyor means using a linear motor have recently been put to practical use. Also, in a clean room of a precision circuit parts manufacturing plant, conveyor means for transporting precision parts should have as small a mechnical contact portion as possible because there is a danger that microscopic dust is generated by parts in frictional contact. In this respect, a non-contact type linear motor system is most suitable.

For the conventional conveyor means using a linear motor, a method in which a transporting pallet loaded with goods for transportation is carried while it is kept lifted by compressed air jet from a transporting duct has been suggested to improve transporting efficiency. However, constant jetting of compressed air covering the whole length of a transporting course involves consumption of a large amount of compressed air. Moreover, in the case of an emergency stop of a transporting pallet during running, it is required to effect automatic return to the original point by inclining the entire transporting course to let a pallet fall by its own weight. In this case, however, there is a difficulty that if the total length of the transporting course is long, the difference in level between the starting point and the terminal point becomes large due to the inclination of the transporting course, with the result of poor transporting efficiency during normal transporting and the necessity of inclination of the operating device. Moreover, it has been found that due to the force of inertia at starting and at stopping of a transporting pallet, goods being transported in a container vibrate, with the result of damage to the goods, generation of foreign matter, adhesion of foreign matter to the goods and this raises a serious problem especially in the case of transporting a container in which many silicon wafers are enclosed in the manufacturing of semiconductor devices because the silicon wafer is composed of thin, brittle material.

SUMMARY OF THE INVENTION

A primary object of the present invention is to eliminate the above-described demerits of the conventional conveyor means and to provide a conveyor means having high transporting efficiency with less consumption of compressed air, using a transporting pallet which can easily be returned to its starting point even if it is stopped at the position where a driving unit is not available.

Another object of the present invention is to provide a conveyor means wherein a transporting pallet itself is inclined, namely, goods for transportation are carried while they are kept inclined in order to reduce vibration during transporting and thereby transport them safely and accurately.

In order to attain the main object, according to the present invention the total length of the transporting course is divided into a plurality of block units and each block unit is provided with a compressed air supply controller and a means for detecting the passage of goods being transported. Based on the output of the detecting means, the compressed air supply controller is actuated. Under this arrangement, with the movement of goods along the transporting course, each block unit of the transporting course effects in turn supply or non-supply of compressed air, thereby confining the consumption (jetting) of compressed air per unit hour to the minimum.

BRIEF EXPLANATION OF THE DRAWING

The present invention is explained below, with reference to a preferred embodiment shown in the drawing, in which.

DETAILED EXPLANATION OF THE INVENTION

Figure 1:
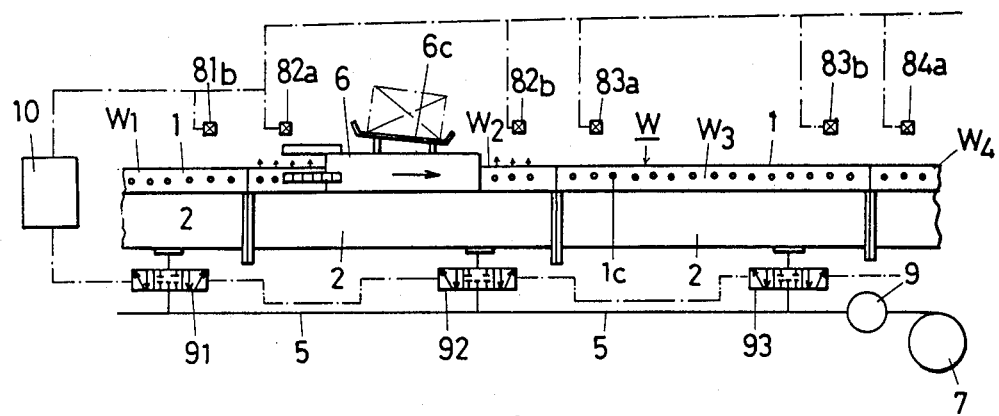
FIG. 1 is an elevation view of a part of the transporting course of a conveyor means using a linear motor according to the present invention.
Figure 2:
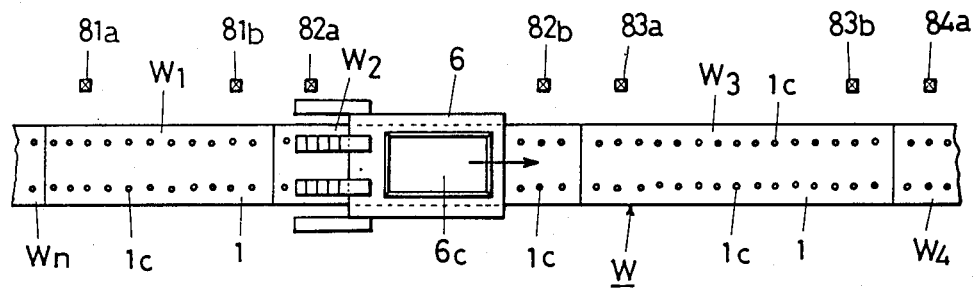
FIG. 2 is a plan view of the part of the transporting course shown in FIG. 1.
Figure 3:
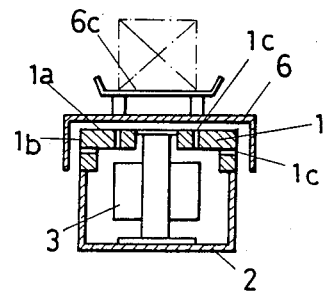
FIG. 3 is a sectional view of the transporting course taken in line III—III in FIG. 1.

In the drawing, W denotes a transporting course or track extending in a linear line, refracted line or combination thereof for carrying goods to be transported to the destination. The total length of this transporting course W is divided into a plurality of block units $W1$, $W2 \ldots Wn$ in turn. Each block unit of the transporting course comprises a horizontal transporting table 1 having downwardly depending side surfaces and a transporting duct 2 integrally joined with the lower edges of the side surfaces of the table 1. The transporting table 1 is made of non-magnetic substance, such as aluminum, stainless steel, synthetic resin or the like, and is symmetrical in relation to the center line of the transporting course. A plurality of nozzles $1c$ are provided in the top surface $1a$ of table 1, here shown in two parallel longitudinally extending lines, and the side surfaces of table 1 have nozzles $1b$ positioned along the length thereof at positions corresponding to the positions of nozzles $1a$.

The transporting table 1 is in airtight relation with a transporting duct 2. A compressed air supply controller, such as an electromagnetic valve, is provided for the duct 2 in each block unit, namely, valves 91, 92, 93 ... $9n$, one for each corresponding block unit $W1$, $W2$, $W3 \ldots Wn$. A linear motor 3 is provided for each block unit, at the central part of the transporting table 1 with a proper space between motors in the transporting direction. Each of compressed air supply control valves 91, 92 ... $9n$ provided along the transporting duct for each block unit is connected to a compressor 7 through a high-pressure duct 5 and a pressure changeover valve 9. Compressed air is supplied, on the basis of selective actuation, from the high-pressure duct 5 into one or two transporting ducts 2 of the transporting course as is desired, through the medium of each control valve 91, 92 ... 9n.

Control by the valves 91, 92 ... 9n is effected by a passage detecting means provided at each block unit of the transporting course. Usually, a pair of passage detecting means are provided for each block unit, for example, means 81a, 81b for the block unit W1 and means 82a, 82b for the block unit W2. Detecting means 81a, 82a, 83a ... 8na at the starting point of each block unit give a signal for closing the valve of the preceding block unit. On the other hand, detecting means 81b, 82b, 83b ... 8nb at the end of each block unit give signals for opening the valves of the following block unit. The valves, the passage detecting means and the compressed air supply control means 10 are connected electrically (or mechanically) so as to issue instructions for such action. Limit switches, phototubes, laser beam, etc. are employed as the passage detecting means.

A transporting pallet 6 is placed on the transporting table 1. At least a bottom part 6a of the transporting pallet 6 is composed of steel plate, copper plate, aluminum plate or the like so as to constitute a reaction plate of the linear motor and thereby obtain thrust from a linear motor. Compressed air sent to the transporting table 1 is jetted upward from the table from the nozzles 1c which are in the top surface of the transporting table. High-pressure air thus jetted forces the bottom reaction plate 6a of the transporting pallet 6 upwardly and accordingly the transporting pallet 6 is lifted in the air. Owing to the jetted air from nozzles 1c at the side of the transporting table, no frictional contact is generated between the transporting table and the pallet and thus the pallet can be transported smoothly.

Figure 4:
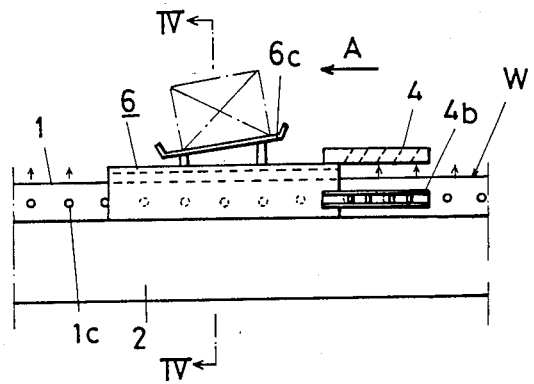
FIG. 4 is an elevation view, on an enlarged scale, showing part of the transporting course with a transporting pallet.
Figure 5:
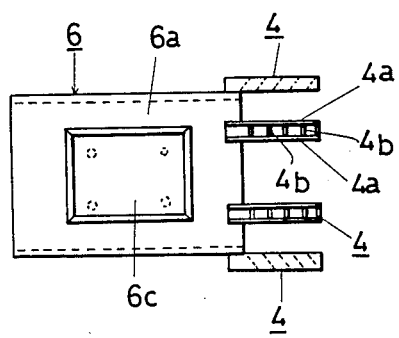
FIG. 5 is a plan view of the transporting pallet of FIG. 4.
Figure 6:
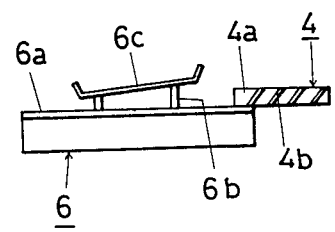
FIG. 6 is an elevation view of the transporting pallet.

The transporting pallet 6 comprises a table 6c to receive goods for transportation thereon, stays 6b supporting the table 6c and propelling blades 4. As shown in FIG. 4 and FIG. 6, the table 6c is inclined in the running direction and is supported on the bottom part 6a by the stays 6b.

Four propelling blades 4 are arranged in such a fashion that two are at the upper surface and one each at the side surfaces symmetrically with the centerline of the conveyor. Each propelling blade comprises a plurality of small blades 4b between side plates 4a. These are made of lightweight material, such as plastic.

An explanation is given below as to how the goods to be transported are carried on a pallet along the transporting course described above.

Compressed air produced by the compressor 7 is supplied to each block unit of the transporting course via the high-pressure duct 5, compressed air supply valves 91, 92, 93 ... 9n and the compressed air supply control means 10 for lifting the transporting table 1 upward. Lifting force is applied to the bottom part 6a of the transporting pallet 6 by the jetted high-pressure air and the pallet is pushed upwardly from the transporting table 1. If electric current is supplied to drive the linear motor 3, the bottom part 6a of the transporting pallet 6 which is the secondary side of the linear motor, receives impellent force due to magnetic flux from the primary side of the linear motor. By this impellent force the transporting pallet 6 is started slowly in the direction shown by the arrows in FIG. 1 and FIG 4. At this time, since silicon wafers in a container (shown in phantom lines) are carried while being kept inclined at a fixed angle as is obvious from FIG. 4, safety in transporting is improved and vibration of silicon wafers due to the force of inertia at the time of starting, stopping, etc. of the transporting pallet is reduced. Thus, damage to the silicon wafers, generation of foreign matter, adhesion of foreign matter to the silicon wafers, etc. can be decreased, whereby goods to be transported are carried safely and accurately.

When the transporting pallet 6 passes a passage detecting means 81b, the passage detecting means 81b gives an output signal indicating the passage of the transporting pallet 6, whereby compressed air supply control means 10 opens the compressed air supply valve 92 for starting the supply of compressed air into the transporting duct 2 and, at the same time, jetting high-pressure air from the nozzles 1c in block unit W2. When the transporting pallet 6 advances further and passes the passage detecting means 82a, the air supply valve 91 provided in block unit W1 is closed by an output signal given by the detecting means 82a through control means 10, whereby supply of compressed air to the transporting duct from the compressor 10 is stopped and only the transporting duct of a block unit W2 where the transporting pallet 6 is present is jetting high-pressure air (the state shown in FIG. 1). Similarly, when the transporting pallet 6 passes the passage detecting means 82b, the compressed air supply valve 93 is opened by an output signal given by the detecting means 82b, through control means 10 and compressed air is supplied to the transporting duct of a block unit W3 from the compressor 7 and, at the same time, jetting high-pressure air from the nozzles 1c. When the transporting pallet 6 reaches the passage detecting means 83a, the compressed air supply valve 92 is closed by an output signal given by the detecting means 83a and supply of compressed air to the transporting duct of W2 is stopped and only the transporting duct of W3 is jetting high-pressure air. Similarly, with further advance of the transporting pallet, compressed air is supplied to the transporting duct of successive block units W1, W2, W3 ... in turn under the control of the compressed air supply control means 10 and supply of compressed air to each block unit is subsequently stopped. In this way, only one block unit where the transporting pallet is present jets high-pressure air and all the other transporting ducts of the block units where the transporting pallet is not present do not effect jetting of high-pressure air. This system reduces the consumption of compressed air (jetting of compressed air) to a minimum.

If a transporting pallet which is running while it is lifted above the transporting table should stop for some reason or other (power failure, mechanical trouble, for example) at a position where no linear driving unit is present, compressed air having a pressure slightly higher than the usual pressure for transportation is blown against the small propelling blades 4b by changing over the pressure changeover valve 9, whereby the pallet is carried in the direction shown by an arrow A in FIG. 4.

According to the present invention, a transporting pallet is transported, out of contact with a transporting table, on the basis of "return to original point in case of emergency stop" and the goods being transported are carried while they are inclined in a fixed direction. Therefore, microscopic dust is not generated during transportation, nor is dust generated by vibration of goods being transported. This means that the carrier according to the present invention is most suitable for use in assembling of precision parts and in medicine manufacturing from which even microscopic dust must be kept away.

As the present invention makes it possible to return goods being transported to their original starting point in case of an emergency stop without the aid of other means, it requires no cost for such equipment and is easy to operate and maintain.

As the present invention comprises a plurality of block units, to each of which compressed air is supplied selectively, consumption of compressed air (jetting of compressed air) can be reduced to the minimum. Furthermore, the present invention ensures high carrying efficiency because of its slow starting and slow stopping without reducing the speed during running.

We claim:

1. A pallet type conveyor comprising:
   a transporting track having a length extending in the direction in which products are to be transported and having a plurality of successive block units;
   a transporting pallet on which products to be transported can be carried and mounted on said track for movement therealong in the direction of the length of said track, said pallet having means cooperating with said track for confining a cushion of compressed air between said pallet and said track for supporting said pallet above said track;
   compressed air supply means for supplying compressed air to said block units in succession and to direct the compressed air against the transporting pallet for supporting said pallet;
   a plurality of linear motor portions forming one part of a linear motor means, one such portion being only in the central part of each of said block units and spaced from the preceding and succeeding linear motor portions for driving said transporting pallet along said track in the direction in which products are to be transported, said pallet having thereon means forming the remainder of said linear motor means, each such portion of said linear motor means being sufficiently long for giving said pallets sufficient momentum to enable them to reach the next successive portion, the spacing being sufficiently great that if a pallet is caused to stop between two such portions the force produced by the linear motor means is insufficient to move the pallet;
   blade means on said pallet in line with the flow of compressed air against said pallet from said compressed air supplying means and oriented to move said pallet in the direction of the length of said track;
   compressed air supply control means for controlling the supply of compressed air to the respective block units to supply compressed air at a first pressure just sufficient to support said pallet above said track and insufficient to drive said pallet along said track when striking said blade means, and for controlling the supply of compressed air to discontinue the supply of compressed air to one block unit after the pallet has passed said one block unit and to start supply of compressed air to a next successive block unit just before the pallet starts to pass said one block unit, and for controlling the supply of compressed air for increasing the pressure of compressed air supplied to said block units to a second pressure higher than said first pressure and sufficient to moving said pallet in the direction of the length of said track when it strikes said blade means, whereby when a pallet is stopped or blocked from being transported at a position between said linear motor portions where it is not able to be driven by said linear motor means, said compressed air supply control means can be actuated to supply compressed air at said second pressure sufficient to move said pallet to a position where it can again be driven by said linear motor means.

2. A conveyor as claimed in claim 1 in which said blade means are shaped to move said pallet in the direction of transporting the products.

3. A conveyor as claimed in claim 2 in which said block units have lines of holes extending in the direction of the length of said track through which compressed air is ejected against said pallet, and said blade means comprise blades positioned in opposed relationship to said lines of holes.

* * * * *